United States Patent
Lenoble et al.

(10) Patent No.: US 7,449,737 B2
(45) Date of Patent: Nov. 11, 2008

(54) PROCESS FOR FABRICATING AN INTEGRATED CIRCUIT COMPRISING A PHOTODIODE, AND CORRESPONDING INTEGRATED CIRCUIT

(75) Inventors: Damien Lenoble, Grenoble (FR); François Roy, Seyssins (FR)

(73) Assignee: STMicroelectronics S.A., Montrouge (FR)

( * ) Notice: Subject to any disclaimer, the term of this patent is extended or adjusted under 35 U.S.C. 154(b) by 30 days.

(21) Appl. No.: 11/481,393

(22) Filed: Jul. 5, 2006

(65) Prior Publication Data
US 2007/0158712 A1    Jul. 12, 2007

(30) Foreign Application Priority Data
Jul. 5, 2005    (FR) .................................. 05 07145

(51) Int. Cl.
*H01L 31/062*    (2006.01)
(52) U.S. Cl. ................................ 257/292; 257/E27.133
(58) Field of Classification Search ................. 257/213, 257/288, 290, 291, 292, E27.132, E27.133; 438/48, 57, 59
See application file for complete search history.

(56) References Cited

U.S. PATENT DOCUMENTS 5,711,812 A * 1/1998 Chapek et al. ........... 118/723 E
6,380,012 B1  4/2002 Chen
6,514,785 B1 * 2/2003 Chiang et al. ................ 438/48
6,632,482 B1 10/2003 Sheng
2001/0039068 A1 11/2001 Lee et al.
2003/0234432 A1 12/2003 Song et al.
2004/0017496 A1  1/2004 Koizumi et al.
2004/0173866 A1 * 9/2004 Egawa et al. ............... 257/462
2004/0188727 A1  9/2004 Patrick
2005/0064665 A1  3/2005 Han
2005/0274988 A1 * 12/2005 Hong ........................ 257/225

OTHER PUBLICATIONS

Preliminary French Search Report, FR 05 07145, dated Apr. 4, 2006.

* cited by examiner

*Primary Examiner*—Evan Pert
*Assistant Examiner*—Kevin Quinto
(74) *Attorney, Agent, or Firm*—Gardere Wynne Sewell LLP

(57) ABSTRACT

An integrated circuit includes at least one photodiode associated with a transfer transistor. The photodiode is formed with an upper pn junction. The transfer transistor includes a lateral spacer located on a side facing the photodiode. An upper layer of the upper pn junction includes a lateral surface extension lying beneath the spacer. A lower layer of the upper pn junction forms a source/drain region for the transfer transistor. An edge of the lateral surface extension lying beneath the spacer and adjacent a gate of the transfer transistor contacts a substrate of the integrated circuit. An oxide layer insulating the gate from the underlying substrate does not overlie the lateral surface extension of the upper layer underneath of the lateral spacer.

10 Claims, 5 Drawing Sheets

PROCESS FOR FABRICATING AN INTEGRATED CIRCUIT COMPRISING A PHOTODIODE, AND CORRESPONDING INTEGRATED CIRCUIT

PRIORITY CLAIM

The present application claims priority from French Application for Patent No. 05 07145 filed Jul. 5, 2005, the disclosure of which is hereby incorporated by reference.

BACKGROUND OF THE INVENTION

1. Technical Field of the Invention

The present invention relates to microelectronics, especially to integrated circuits comprising photodiodes.

2. Description of Related Art

Image sensors based on semiconductor components rely on the principle of converting photons into electron/hole pairs in silicon. More precisely, the charges created in the photosensitive regions are stored in the photodiode and then read by an electronic system. This electronic system, which controls the photodiode, includes in particular a transfer transistor permitting the charges stored in the photodiode to be transferred.

"Imager" technologies are sensitive to parasitic photodiode currents generated during conversion of the optical information into electrical information. In particular, there is a parasitic current called dark current, which is transferred by the read transistors when the photodiodes are not illuminated. This is characteristic of the sensitivities at low luminance of optical sensors based on CMOS technology.

However, to improve the resolution of the image taken, the dark current must be as low as possible.

There is a need to provide a solution to this problem.

SUMMARY OF THE INVENTION

A solution results firstly from identifying the main cause of the dark currents. More precisely, it has been observed that a substantial portion of the dark current is generated on the surface, in the contact region of the dielectric and in the space charge region of the photodiode beneath the spacer of the transfer transistor. Under these conditions, an embodiment of the invention solves the problem by eliminating the contact region of the space charge region of the photodiode and of the surface dielectric at the spacer.

One subject of the invention is an integrated circuit comprising at least one photodiode associated with a transfer transistor, said photodiode having an upper pn junction and the transistor having a lateral spacer located on the side facing the photodiode.

According to one general feature of this subject of the invention, the upper pn junction includes a lateral surface extension lying beneath the spacer.

In other words, the photodiode according to the invention comprises a surface layer extending beneath the spacer, unlike the photodiodes that already exist in which said layer stops at the implantation of the spacer.

Currently, the process for fabricating imagers is based on a pnp photodiode storing the photogenerated electrons, which are then transferred into the read circuit, and the signal is processed by an nMOS transistor which is conducting while the optoelectronic information is being read.

However, during the process of fabricating imagers, physical defects, such as crystal defects or contaminations, may be created in the space charge region of the pnp photodiode. These defects may be electrically active if they modify the carrier generation/recombination currents in the space charge region that stores, in normal operation, the charges photogenerated in the silicon.

The space charge region, defined by the photodiode implantation processes, is distributed spatially in the CMOS architecture. Thus, any contact with the space charge region of the photodiode on dielectric interfaces, for example based on silicon, $SiO_2$, SiON or $Si_3N_4$, is also liable to modify the state of charge of the photodiode and consequently the value of the dark current.

The photodiode architecture proposed thus overcomes the interface problems associated with oxide/silicon contact beneath the spacer, without significantly modifying the characteristics of the photodiode, for example the diode potential, and the electrical characteristics of the transfer transistor.

According to one embodiment, the thickness of the surface extension is less than 20 nm.

According to one embodiment, the upper layer includes a part that is thicker than the surface extension and is located to the outside of the spacer.

The subject of the invention is also an image sensor that may comprise at least one integrated circuit, as defined above.

Another subject of the invention is a process for fabricating an integrated circuit, comprising, in a semiconductor substrate, a photodiode possessing an upper pn junction and a transfer transistor associated with the photodiode.

According to a general feature of this other subject of the invention, the insulated gate of the transfer transistor is produced on the substrate, then an initial semiconductor region having a first type of conductivity is formed on the substrate on one side of the transistor and then a surface layer having a second type of conductivity, the opposite of the first, is produced within this initial semiconductor region before the lateral spacers of the insulated gate are produced, this surface layer belonging to the upper layer of the upper pn junction.

Advantageously, the thickness of the surface layer is less than 20 nm.

Furthermore, according to one method of implementation, the surface layer is produced by implantation using a plasma doping process.

The use of a plasma doping process has the advantage of being able to produce a very thin surface layer. This means that the characteristics of the photodiode are not impaired.

According to one method of implementation, a thicker part of the upper layer of the upper pn junction is produced in the initial semiconductor region by a second implantation through the exposed part of the surface layer.

In an embodiment, an integrated circuit comprises a photodiode formed in a semiconductor substrate and including an upper pn junction comprising a buried semiconductor region having a first type of conductivity and an overlying surface layer having a second type of conductivity. A transfer transistor is associated with the photodiode and comprises an insulated gate which overlies the semiconductor substrate. Lateral spacers for the insulated gate are formed, at least one of which overlies a lateral surface extension of the surface layer having the second type of conductivity.

In an embodiment, a process for fabricating an integrated circuit comprises: producing, in a semiconductor substrate, a photodiode possessing an upper pn junction comprising an initial semiconductor region having a first type of conductivity formed in the substrate and an overlying surface layer having a second type of conductivity; producing a transfer transistor associated with the photodiode comprising an insulated gate which overlies the semiconductor substrate; and producing lateral spacers for the insulated gate at least one of which overlies a lateral surface extension of the overlying surface layer having the second type of conductivity.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
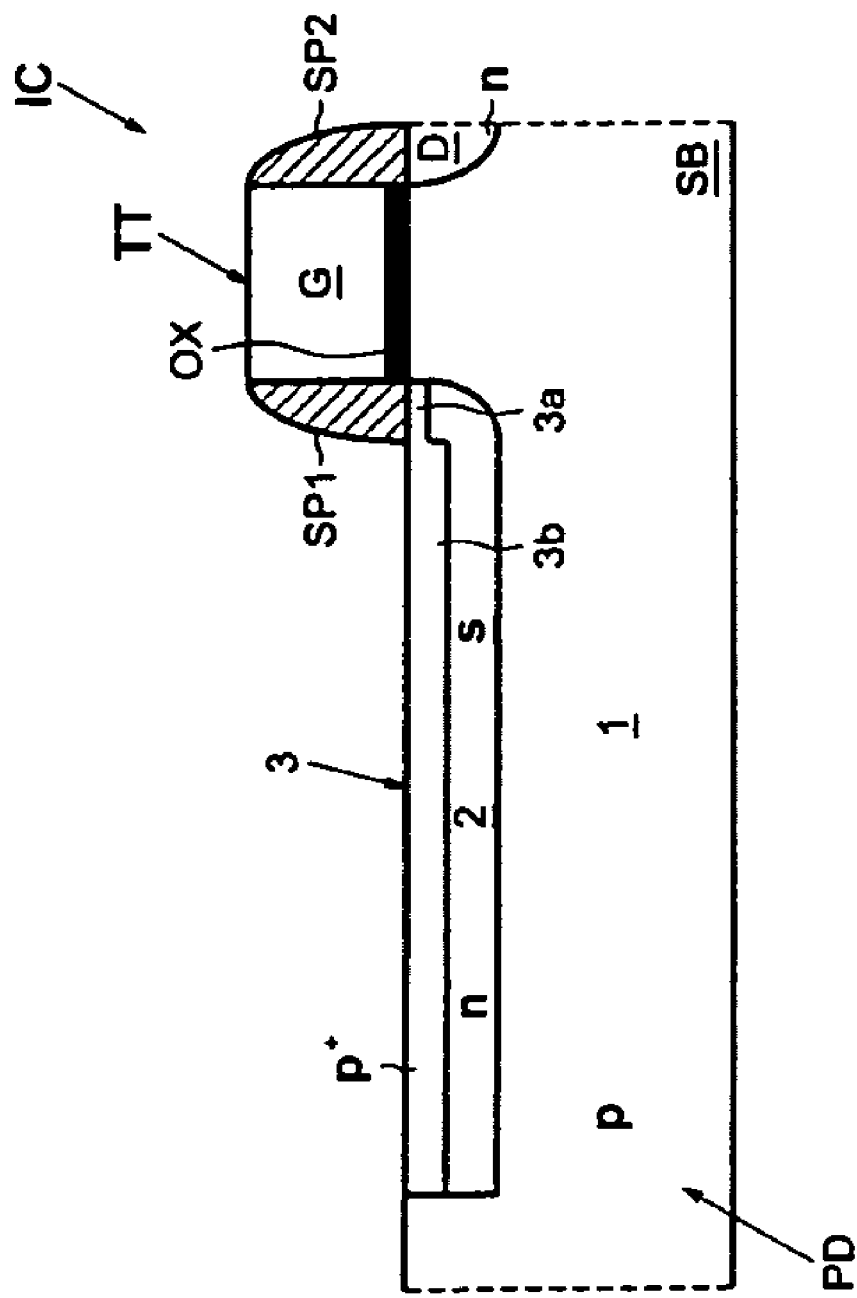
FIG. 1 shows one embodiment of an integrated circuit according to the invention.
Figure 2:
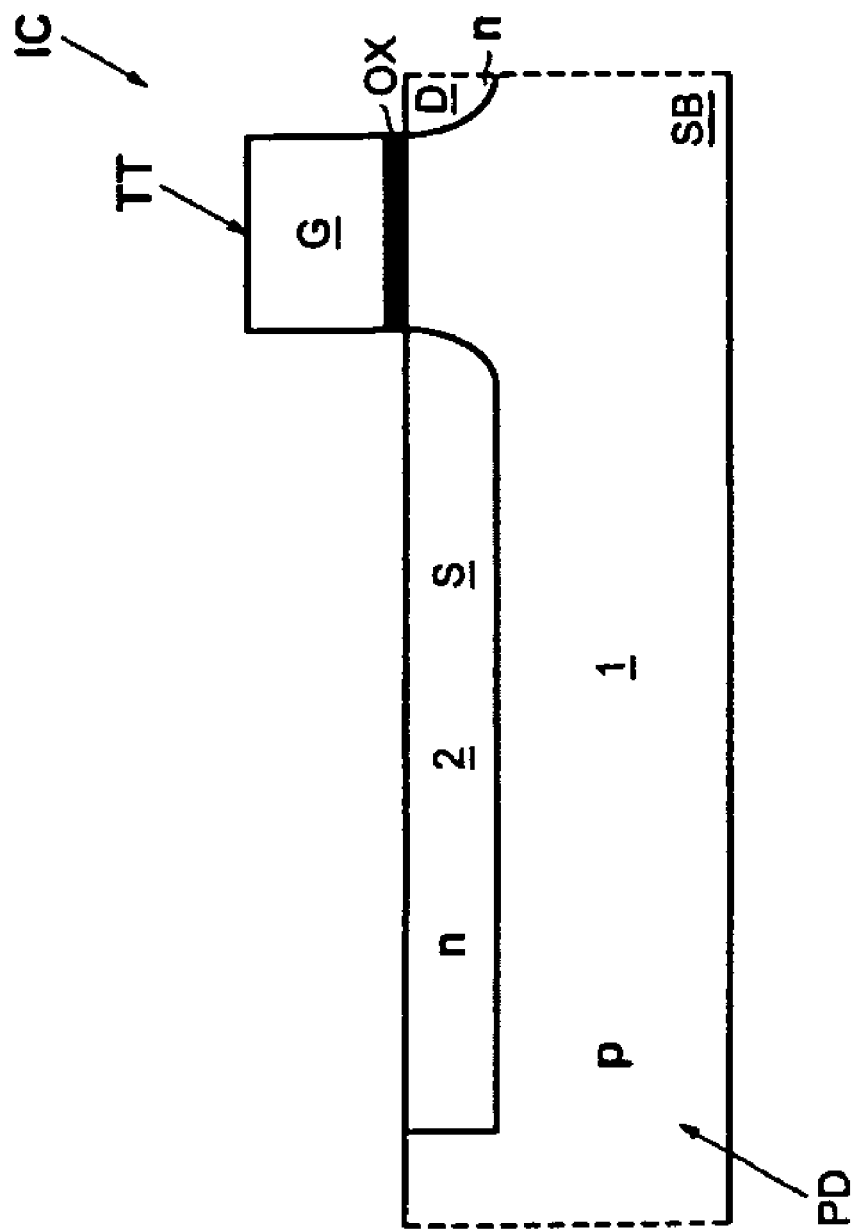
FIGS. 2 to 5 illustrate schematically the main steps of one method of implementing the fabrication process according to the invention.

FIG. 1 shows an integrated circuit IC. The reference SB denotes a semiconductor substrate, here made of p doped silicon. This substrate SB may be a p-type semiconductor wafer or else a p-doped well located within an n-type semiconductor wafer. The transfer transistor TT is an MOS transistor whose n-doped source S forms, for the photodiode PD, an intermediate layer 2 that extends above the part 1 of the substrate SB.

Two spacers SP1 and SP2 back onto each sidewall of the gate G of the transistor TT.

The transistor TT is also insulated from the substrate SB by an oxide layer OX.

A $p^+$-doped upper layer 3 is produced on top of this intermediate layer 2. The part 1 of the substrate SB also comes into contact with the $p^+$-doped upper layer 3. This layer 3 comprises a thicker part 3b and also a lateral surface extension 3a lying beneath the spacer SP1.

The photodiode PD is therefore formed here from these three layers, which define two pn junctions (diodes), namely an upper junction, formed from the layers 2 and 3, and a lower junction, formed from the layer 2 and the subjacent part of the substrate 1.

The main steps of one method of implementing the process according to the invention will now be described more particularly with reference to FIGS. 2 to 5.

The gate G of the transfer transistor TT resting on the upper surface of the substrate SB via a gate oxide layer OX is produced (FIG. 2) in a conventional manner known per se.

Next, a source region and a drain region are produced by implantation using a technique well known to those skilled in the art.

Figure 3:
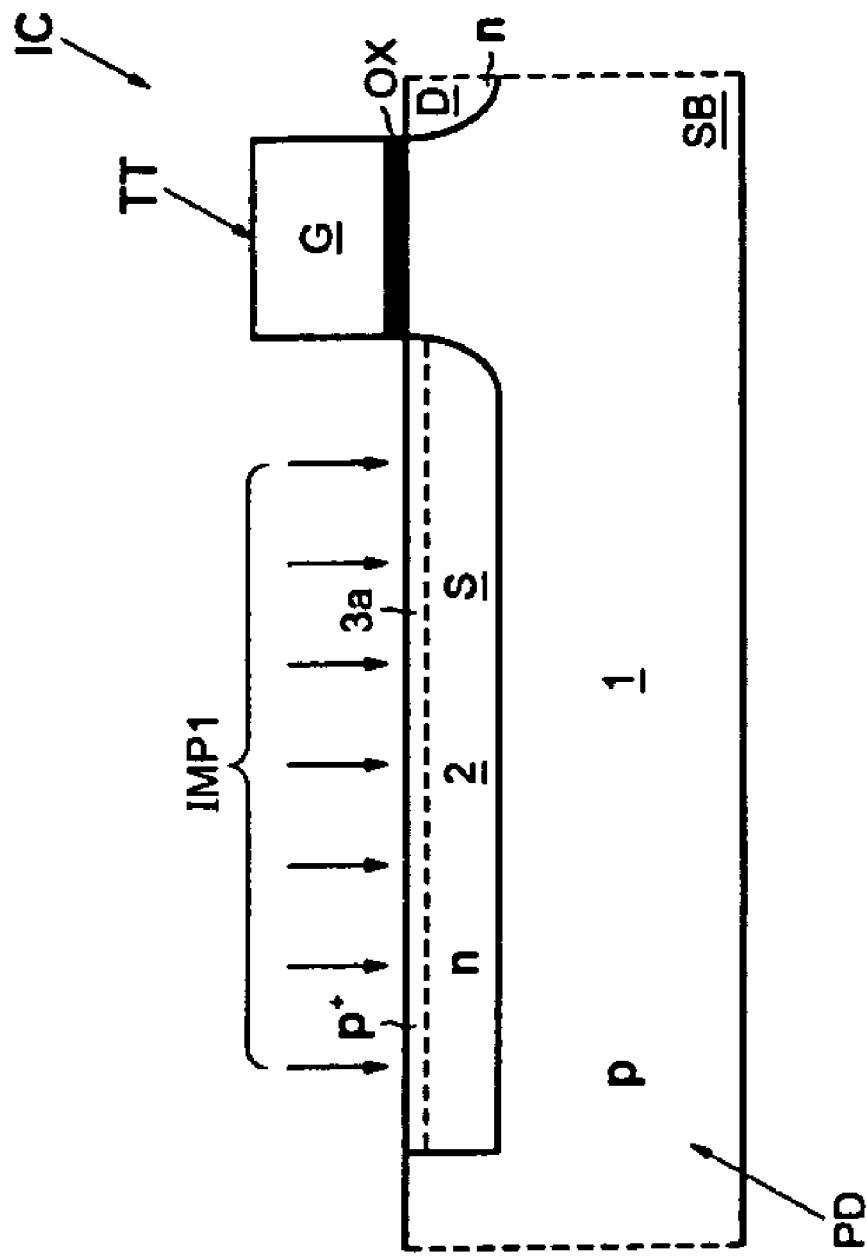

As illustrated in FIG. 3, after the gate G and drain D regions have been masked, a first dopant implantation IMP1 is carried out so as to produce a $p^+$-doped surface layer 3a.

This surface layer may be produced by implantation using a plasma doping process. This technique, well known to those skilled in the art, is described for example in U.S. Pat. Nos. 6,632,482 and 6,380,012, the disclosures of which are hereby incorporated by reference.

The use of plasma doping is characterized, compared with standard ion implantation, by a very shallow surface doping profile, for example 200 Å in depth, that is impossible to reproduce in standard ion implantation, owing to the very low acceleration energies involved (for example less than 1 keV) and the high thermal budgets used.

As an indication, for boron doping, the precursor gas used is then boron trifluoride $BF_3$ and the applied voltages are less than 1 kV. The implanted doses are then less than $10^{15}/cm^2$. More generally, the plasma doping process may use any electrically active, p-type or n-type, dopant gas as precursor, depending on the imager architecture developed.

In addition, given that the plasma doping process is self-aligned with respect to the gate, the sequence of processes for producing an integrated circuit according to the invention is a standard one.

Figure 4:
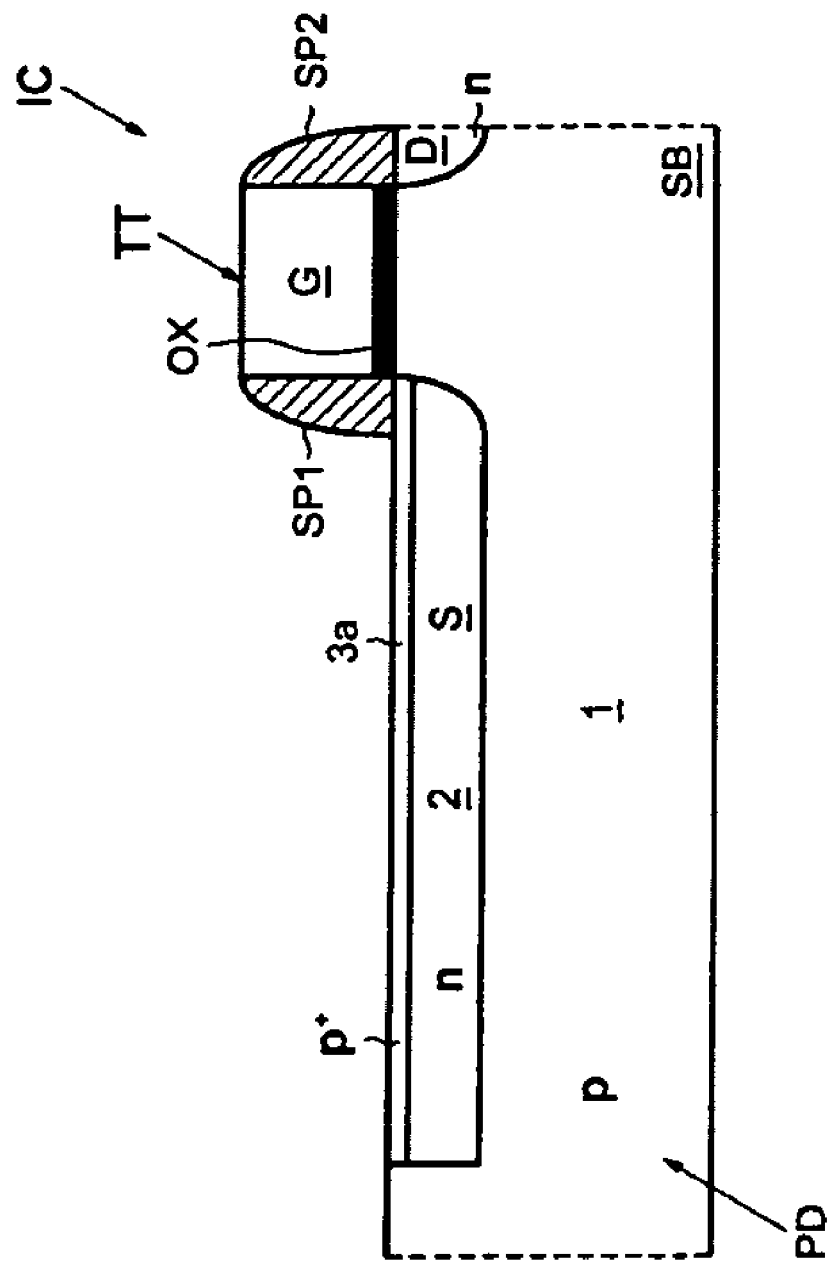

Next, as may be seen in FIG. 4, the spacers SP1 and SP2 of the transistor TT are produced, in a conventional manner known per se, on top of the substrate 1, on the sidewalls of the gate G. Furthermore, the spacer SP1 is produced on top of the surface layer 3a, which was produced during the previous step.

Figure 5:
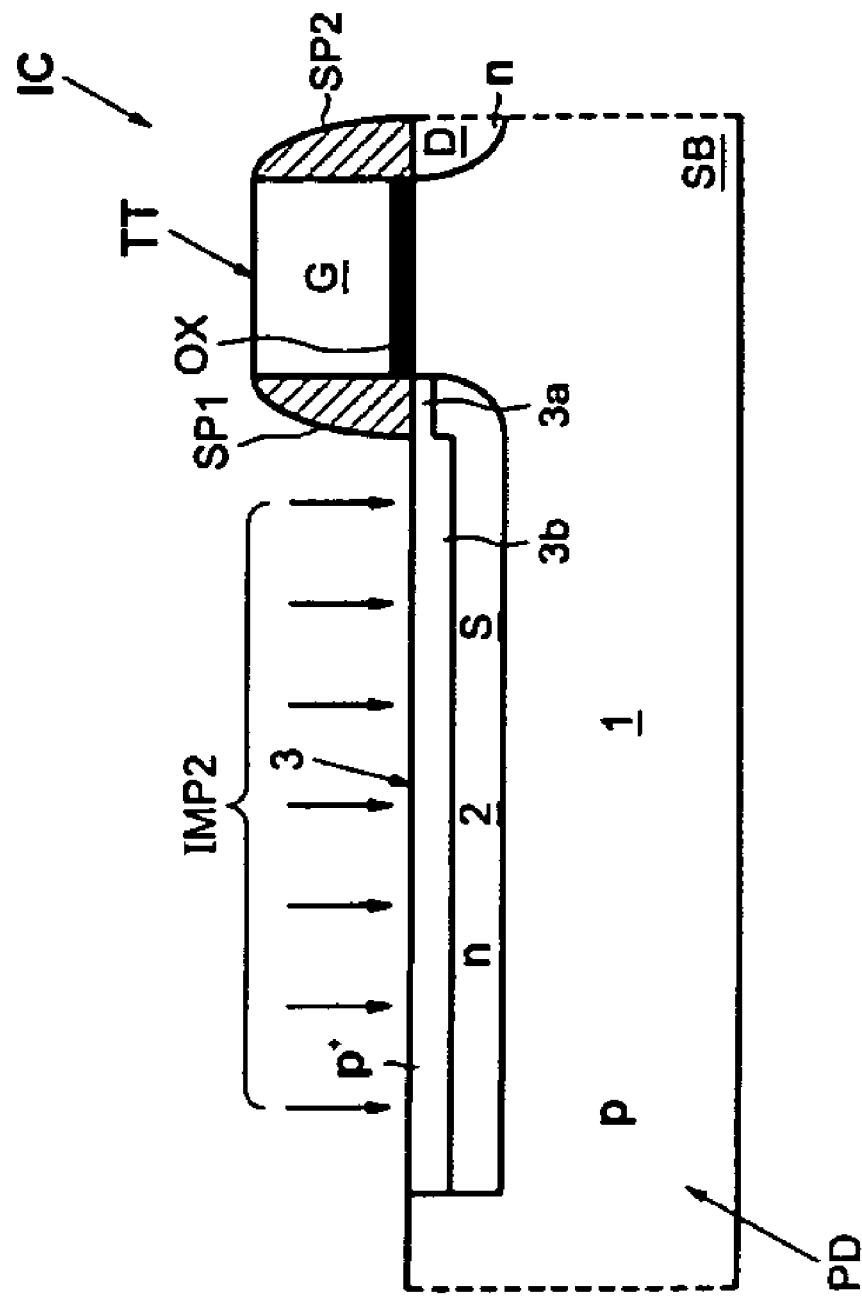

Next, as illustrated in FIG. 5, a second dopant implantation IMP2 is carried out so as to produce the $p^+$-doped layer 3b.

Unlike the surface layer 3a, the layer 3b stops at the implantation of the spacer SP1.

Although in theory this second implantation IMP2 is not necessary for solving the dark current problem, it is nevertheless advantageous. This is because it reinforces the surface layer 3a produced by a plasma doping process, which is consequently a very thin layer. The thickness of the lateral surface extension of the surface layer 3a is less than 20 nm. This second implantation IMP2 also obviates any damage of the surface layer 3a during formation of the spacers SP1 and SP2.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit comprising:
   a photodiode formed in a semiconductor substrate and including an upper pn junction comprising a buried semiconductor region having a first type of conductivity and an overlying surface layer having a second type of conductivity;
   a transfer transistor associated with the photodiode comprising an insulated gate; and
   lateral spacers for the insulated gate at least one of which overlies a lateral surface extension portion of the overlying surface layer having the second type of conductivity;
   wherein the lateral surface extension portion has a first constant thickness extending for a first distance underneath the at least one lateral spacer;
   wherein the overlying surface layer further has a second constant thickness extending for a second distance outside the lateral spacer; and
   wherein the buried semiconductor region of the photodiode is also a source region for the transfer transistor, and further wherein the buried semiconductor region does not contact an insulating layer associated with the insulated gate.

2. The circuit of claim 1 wherein an inside edge of the lateral surface extension of the overlying surface layer is aligned with an edge of the insulated gate.

3. The circuit of claim 2 wherein the inside edge of the lateral surface extension of the overlying surface layer contacts the semiconductor substrate.

4. The circuit of claim 1, wherein the first constant thickness of the lateral surface extension of the overlying surface layer is less than 20 nm.

5. The circuit of claim 1 wherein the lateral surface extension of the overlying surface layer beneath the at least one lateral spacer is thinner than the overlying surface layer outside of the at least one lateral spacer.

6. The circuit of claim 1 wherein an inside edge of the lateral surface extension of the overlying surface layer adjacent the insulated gate contacts the semiconductor substrate.

7. The circuit of claim 1 wherein a gate oxide separates the insulated gate from the semiconductor substrate and wherein the gate oxide does not overlie the lateral surface extension of the surface layer underneath of the lateral spacer, and further wherein the buried semiconductor region does not contact the gate oxide underneath the insulated gate.

8. The circuit of claim 1 wherein a thickness transition region of the overlying surface layer from the first constant thickness to the second constant thickness is aligned with an outside edge of the lateral spacer.

9. The integrated circuit according to claim 1, wherein the first distance is substantially a width of the lateral spacer and the second distance is substantially a width of the overlying surface layer outside the lateral spacer.

10. An integrated circuit comprising:
    a photodiode formed in a semiconductor substrate and including an upper pn junction comprising a buried semiconductor region having a first type of conductivity and an overlying surface layer having a second type of conductivity;
    a transfer transistor associated with the photodiode comprising an insulated gate;
    lateral spacers for the insulated gate at least one of which overlies a lateral surface extension portion of the overlying surface layer having the second type of conductivity;
    wherein the lateral surface extension portion has a first constant thickness extending for a first distance underneath the at least one lateral spacer;
    wherein the overlying surface layer further has a second constant thickness extending for a second distance outside the lateral spacer; and
    wherein a gate oxide separates the insulated gate from the semiconductor substrate and wherein the gate oxide does not overlie the lateral surface extension of the surface layer underneath of the lateral spacer, and further wherein the buried semiconductor region does not contact the gate oxide underneath the insulated gate.

* * * * *